United States Patent
Chuang et al.

(12) 
(10) Patent No.: US 6,373,281 B1
(45) Date of Patent: Apr. 16, 2002

(54) TRI-STATE DYNAMIC BODY CHARGE MODULATION FOR SENSING DEVICES IN SOI RAM APPLICATIONS

(75) Inventors: Ching-Te Kent Chuang, South Salem, NY (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/767,218

(22) Filed: Jan. 22, 2001

(51) Int. Cl.[7] ............................................... H03K 19/00
(52) U.S. Cl. .............................. 326/58; 326/33; 326/34
(58) Field of Search ............................ 376/56, 57, 33, 376/34; 327/534, 535, 537

(56) References Cited

U.S. PATENT DOCUMENTS

| | | | | |
|---|---|---|---|---|
| 5,874,851 A | * | 2/1999 | Shiota | 327/537 |
| 6,097,113 A | * | 8/2000 | Teraoka et al. | 307/125 |
| 6,118,328 A | * | 9/2000 | Morikawa | 327/534 |

OTHER PUBLICATIONS

"SOI–DRAM Circuit Technologies For Low Power High Speed Multi–giga Scale Memories" by S. Kuge et al., Digest Tech. Papers, Symposium on VLSI Circuits, 1995, pp. 103–104.

U.S. patent application Ser. No. 09/498,387 filed Feb. 3, 2000, by Allen at al. "SOI CMOS Sense Amplifier with Enhanced Matching Characteristics and Sense Point Tolerance".

* cited by examiner

*Primary Examiner*—Michael Tokar
(74) *Attorney, Agent, or Firm*—Joan Pennington

(57) ABSTRACT

A method and apparatus are provided for tri-state dynamic body charge modulation for sensing devices in silicon-on-insulator (SOI) complementary metal oxide semiconductor (CMOS) applications. A sense amplifier includes a silicon-on-insulator (SOI) field effect transistor. A tri-state body charge modulation circuit is coupled to a body of the silicon-on-insulator (SOI) field effect transistor. The body charge modulation circuit provides a high body bias preparatory state; a floating body state and a low body bias stand-by state enabling high performance operation, good matching characteristics, and low stand-by leakage suitable for low-power applications. The tri-state body charge modulation circuit includes a P-channel field effect transistor (PFET) and an N-channel field effect transistor (NFET) connected between a high voltage potential and ground. The junction of the series connected PFET and NFET is coupled to the SOI FET body for providing a charging path to a high power supply voltage rail and a discharging path to ground and a high impedance state.

17 Claims, 3 Drawing Sheets

TRI-STATE DYNAMIC BODY CHARGE MODULATION FOR SENSING DEVICES IN SOI RAM APPLICATIONS

FIELD OF THE INVENTION

The present invention relates generally to complementary metal oxide semiconductor (CMOS) random access memory (RAM) applications, and more particularly, relates to a method and apparatus for tri-state dynamic body charge modulation for sensing devices in silicon-on-insulator (SOI) complementary metal oxide semiconductor (CMOS) random access memory (RAM) applications.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology will lead to the development of more complex and faster computer integrated circuits that operate with less power.

SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology, faster MOS transistors can be manufactured resulting in faster electronic devices.

Dynamic and dual rail silicon-on-insulator (SOI) complementary metal oxide semiconductor (CMOS) circuits are prone to performance variation and mismatch in transfer characteristics due to body potential and threshold voltage differentials. This is a direct result of circuit operating history and dissimilar time constants to charge and discharge field effect transistor (FET) bodies as compared with the actual access times or cycle times. Repetitive read operations performed on a sense amplifier over time can result in significant body potential bias, and consequently mismatches in FET threshold voltage and amplifier transfer characteristics. This degrades the circuit noise margin, reduces the differential gain and switching sensitivity of the amplifier, lowers performance, and can potentially cause logic faults.

Various arrangements are known for silicon-on-insulator (SOI) complementary metal oxide semiconductor (CMOS) technologies.

SOI DRAM circuit arrangements are disclosed by S. Kuge et al. in a publication entitled "SOI-DRAM Circuit Technologies For Low Power High Speed Multi-giga Scale Memories", Digest Tech. Papers, Symposium on VLSI Circuits, 1995, pp. 103–104. A synchronous technique of body-bias control is described for SOI devices. A problem with the disclosed sense amplifier arrangement is that the sense amplifier may be jammed or temporarily inhibited during active switching.

U.S. patent application Ser. No. 09/498,387 filed Feb. 3, 2000, by Allen et al. and entitled "SOI CMOS SENSE AMPLIFIER WITH ENHANCED MATCHING CHARACTERISTICS AND SENSE POINT TOLERANCE" discloses a silicon-on-insulator (SOI) complementary metal oxide semiconductor (CMOS) sense amplifier with improved matching characteristics and sense point tolerance under no penalty of performance degradation. The sense amplifier includes a silicon-on-insulator (SOI) field effect transistor. A flooding field effect transistor is coupled to a body of the silicon-on-insulator (SOI) field effect transistor. The flooding field effect transistor is activated before the sense amplifier is set. The flooding field effect transistor has an opposite polarity of the silicon-on-insulator (SOI) field effect transistor. The flooding field effect transistor provides a charging path to a voltage supply rail. A pair of flooding field effect transistors serve as charging to voltage supply rail elements for silicon-on-insulator (SOI) field effect transistors on each side of complementary bitline structures of the sense amplifier. The flooding field effect transistor is substantially smaller than the silicon-on-insulator (SOI) field effect transistor. While this patent application discloses improvements over other known arrangements, substantial leakage current may exist at stand-by.

A need exists for improved complementary metal oxide semiconductor (CMOS) sense amplifiers in silicon-on-insulator (SOI) technologies. It is desirable to provide a method and apparatus for tri-state dynamic body charge modulation for sensing devices in silicon-on-insulator (SOI) complementary metal oxide semiconductor (CMOS) applications, such as random access memory (RAM) applications. It is desirable to provide such method and apparatus that enables high performance operation, good matching characteristics, and low stand-by leakage suitable for low-power RAM applications.

SUMMARY OF THE INVENTION

A principal object of the present invention is to provide a method and apparatus for tri-state dynamic body charge modulation for sensing devices in silicon-on-insulator (SOI) complementary metal oxide semiconductor (CMOS) applications, such as random access memory (RAM) applications. Other important objects of the present invention are to provide such method and apparatus for tri-state dynamic body charge modulation for sensing devices in silicon-on-insulator (SOI) complementary metal oxide semiconductor (CMOS) applications substantially without negative effect and that overcome many of the disadvantages of prior art arrangements.

In brief, a method and apparatus are provided for tri-state dynamic body charge modulation for sensing devices in silicon-on-insulator (SOI) complementary metal oxide semiconductor (CMOS) applications. A sense amplifier includes a silicon-on-insulator (SOI) field effect transistor. A tri-state body charge modulation circuit is coupled to a body of the silicon-on-insulator (SOI) field effect transistor. The body charge modulation circuit provides a high body bias preparatory state; a floating body state and a low body bias stand-by state.

In accordance with features of the invention, the tri-state body charge modulation circuit includes a P-channel field effect transistor (PFET) and an N-channel field effect transistor (NFET) connected in series between a high voltage potential and a low voltage potential. The junction of the series connected PFET and NFET is coupled to the SOI FET body for providing a high impedance state, a charging path to a high voltage potential and a discharging path to a low voltage potential. The tri-state body charge modulation circuit includes a NAND gate and a NOR gate providing a high body voltage signal and a low body voltage signal. The high body voltage signal output of the NAND gate is applied to the gate of PFET. The low body voltage signal output of the NOR gate is applied to the gate of NFET.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
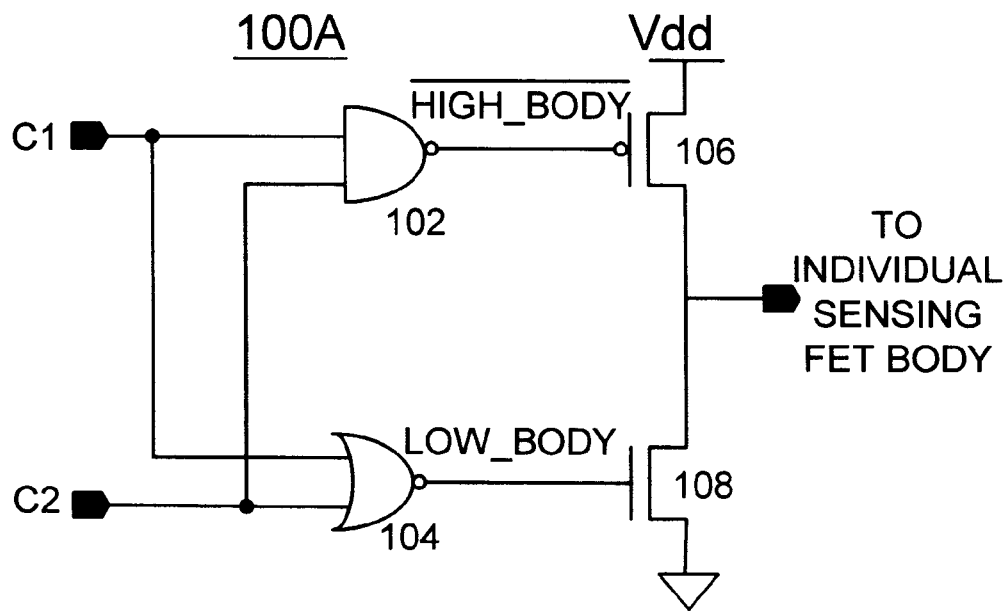
FIG. 1A is a schematic diagram representation illustrating a tri-state body charge modulation arrangement in accordance with the preferred embodiment.

Having reference now to the drawings, in FIG. 1A, there is shown a tri-state body charge modulation circuit of the preferred embodiment generally designated by the reference character 100A. Tri-state body charge modulation circuit 100A includes a NAND gate 102 and a NOR gate 104, each receiving a pair of input signals C1, C2 and respectively providing a complementary high_body signal and a low_ body signal. Tri-state body charge modulation circuit 100A includes a P-channel field effect transistor (PFET) 106 and an N-channel field effect transistor (NFET) 108 connected between a voltage supply Vdd and ground. The high_body signal output of NAND gate 102 is applied to the gate of PFET 106. The low_body signal output of NOR gate 104 is applied to the gate of NFET 108. The junction of the series connected PFET 106 and NFET 108 is coupled to an individual sensing FET body for providing a charging path to a high power rail Vdd and a discharging path to ground. It should be understood that the high body bias voltage can be but is not limited to high power rail Vdd and the low body bias voltage can be but is not limited to ground.

Figure 1B:
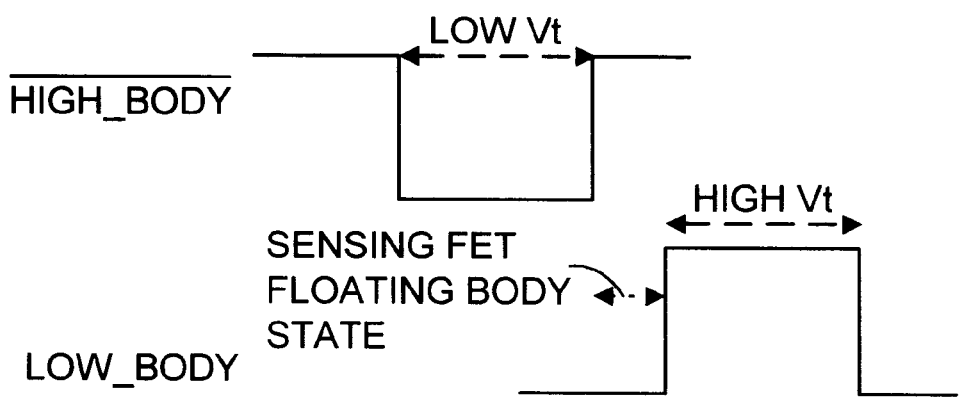
FIG. 1B is a diagram illustrating tri-state body biasing voltages in accordance with the preferred embodiment.

Referring also to FIG. 1B, there are shown tri-state body biasing voltages in accordance with the preferred embodiment. The complementary high_body signal output of NAND gate 102 applied to the gate of PFET 106 and the low_body signal output of NOR gate 104 applied to the gate of NFET 108 are shown. Three FET body states are made available at predetermined times of the operation including a low Vt state before the sense amplifier is set, a floating body state during sense amplifier set and a high Vt state after the sense amplifier is set.

In accordance with the preferred embodiment, the tri-state body charge modulation circuit 100A enables high performance operation, good matching characteristics, and low stand-by leakage suitable for low-power applications, such as RAM applications. As shown in FIG. 1B, the low Vt state is a high body bias preparatory state to achieve matching and high performance. The floating body state is a high impedance state of the body charging device output to achieve high gain sensing action. The high Vt state is a low body bias stand-by state to reduce leakage and achieve low stand-by power.

Figure 2:
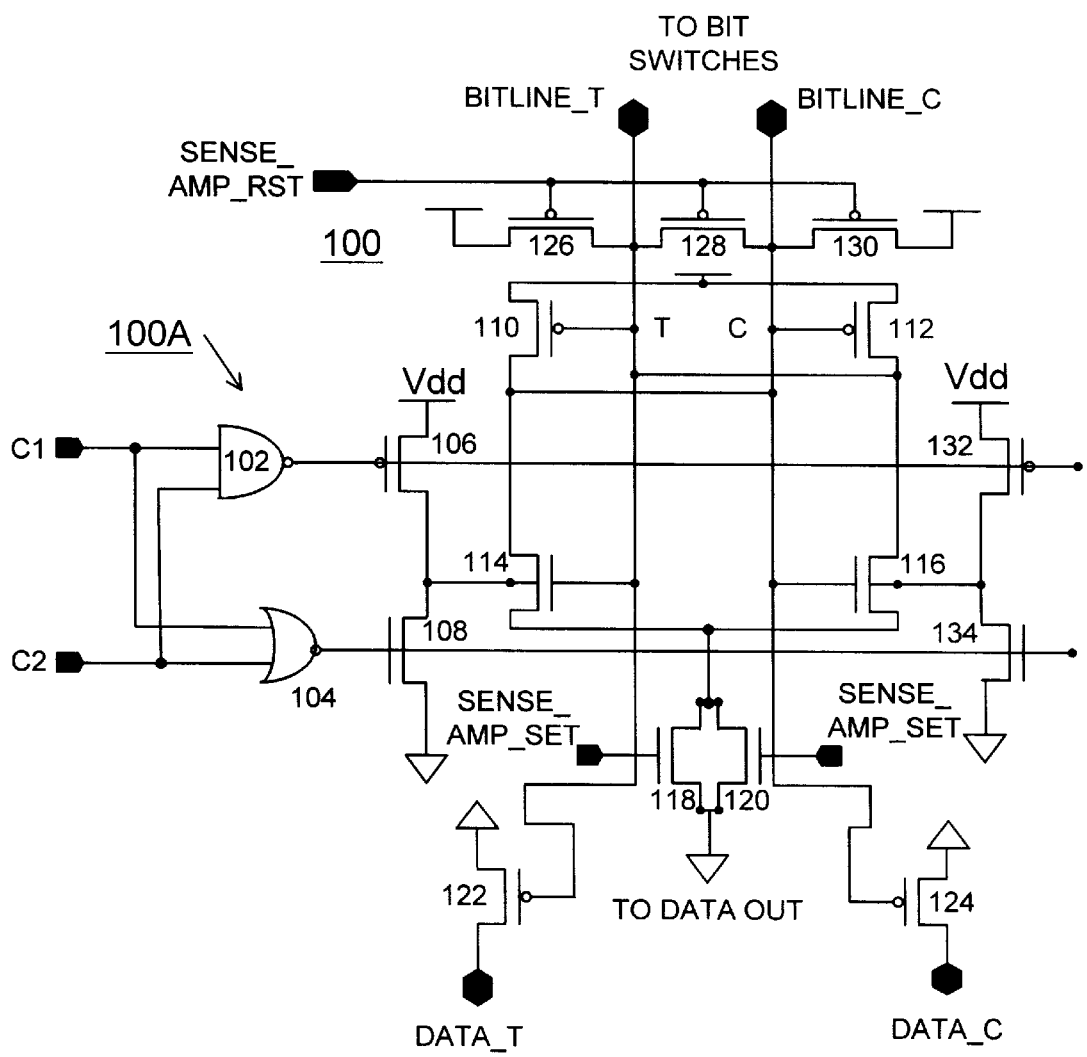
FIG. 2 is a schematic and block diagram representation illustrating a tri-state body charge modulation arrangement for a silicon-on-insulator (SOI) complementary metal oxide semiconductor (CMOS) latch-type sense amplifier in accordance with the preferred embodiment.

Referring now to FIG. 2, there is shown a SOI CMOS sense amplifier circuit of the preferred embodiment generally designated by the reference character 100. SOI CMOS sense amplifier 100 includes the tri-state body charge modulation circuit 100A. As shown in FIG. 2, SOI CMOS sense amplifier 100 includes a pair of P-channel field effect transistors (PFETs) 110 and 112 respectively connected between a voltage supply Vdd and a pair of sensing SOI N-channel field effect transistors (NFETs) 114 and 116. A gate of PFET 110 and NFET 114 is connected to a Bitline_ T. A gate of PFET 112 and NFET 116 is connected to a Bitline_C. A pair of NFETs 118 and 120 connected between NFETs 114 and 116 and ground, receives a gate input of sense_amp_set. A pair of P-channel field effect transistors (PFETs) 122 and 124 having a respective gate input of Bitline_T and Bitline_C, are respectively connected between ground and data out, Data_T and Data_C. A gate input of sense_amp rst is applied to a gate of PFETs 126, 128 and 130. PFETs 126 and 130 are respectively connected between voltage supply Vdd and Bitline_T or Bitline_C. PFET 128 is connected between Bitline_T and Bitline_C.

SOI CMOS sense amplifier 100 includes the NAND gate 102 and NOR gate 104 of the tri-state body charge modulation circuit 100A that advantageously are shared by multiple columns/sense amplifiers. NAND gate 102 and NOR gate 104 are illustrated to show logic functionality and are designed with optimized drive capability and minimized layout area. A second P-channel field effect transistor (PFET) 132 and a second N-channel field effect transistor (NFET) 134 is connected between a voltage supply Vdd and ground. The high_body signal output of NAND gate 102 is applied to the gate of PFET 132. The low_body signal output of NOR gate 104 is applied to the gate of NFET 134. The junction of the series connected PFET 132 and NFET 134 is coupled to the body of sensing NFET 116. The junction of the series connected PFET 106 and NFET 108 of the tri-state body charge modulation circuit 100A is coupled to the body of sensing NFET 114.

In accordance with the preferred embodiment, SOI CMOS sense amplifier 100 including the tri-state body charge modulation circuit 100A provides at appointed or predetermined times of the operation, three body states for the sensing NFETs 114 and 116 including low Vt state, floating body state and high Vt state. A first low Vt state or high body bias state equalizes the two sensing FET bodies and anticipates the sensing action by setting both devices at the low Vt condition. The floating body state for both sensing NFETs 114 and 116 is made possible by enabling the high-impedance function. High-speed sensing is achieved during the floating body mode of operation. The high Vt state or low body bias state follows when the sensing action is completed. SOI CMOS sense amplifier 100 is returned to a stand-by state, which has very low subthreshold leakage current. This state enables low power consumption. The tri-state body control of the preferred embodiment enables the use of low Vt SOI CMOS devices when prompted by performance considerations. The use of low Vt SOI CMOS devices would aggravate disadvantages of known arrangements.

Figure 3A:
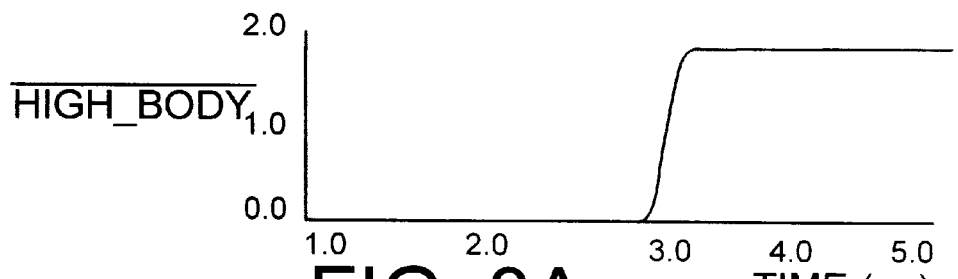
FIGS. 3A, 3B, 3C and 3D are diagrams illustrating a set of exemplary voltage waveforms for the SOI CMOS latch-type sense amplifier of FIG. 2 in accordance with the preferred embodiment.
Figure 3B:
Figure 3C:
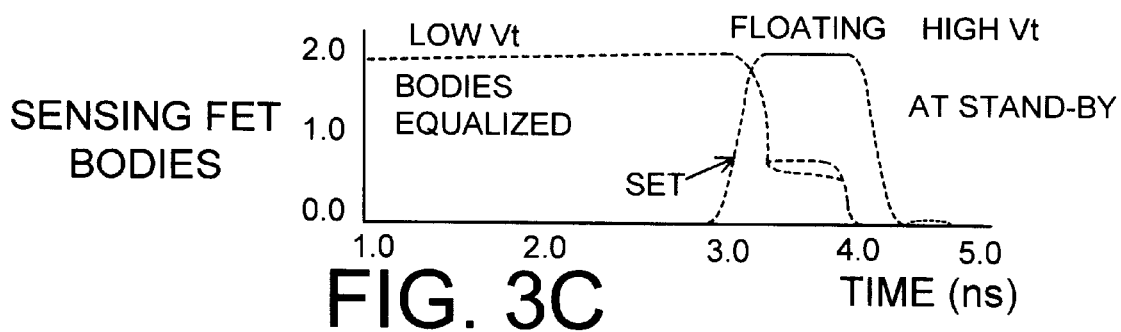
Figure 3D:
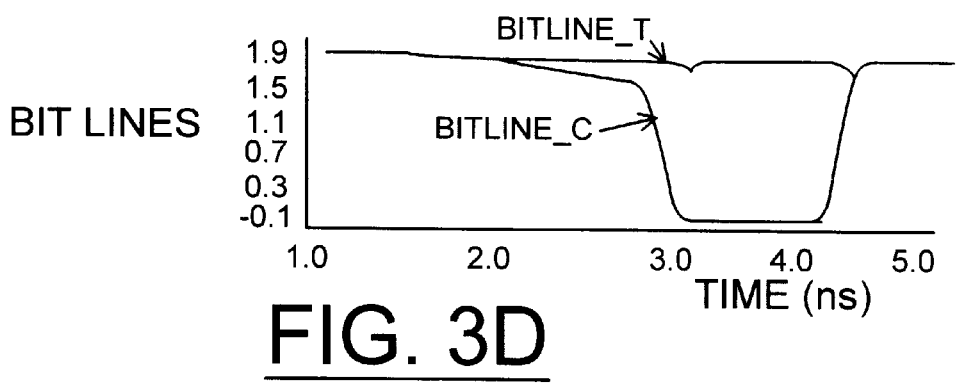

FIGS. 3A, 3B, 3C and 3D provide simulations of exemplary voltage waveforms to understand the operation for the SOI CMOS latch-type sense amplifier 100 in accordance with the preferred embodiment. FIGS. 3A, 3B, 3C and 3D are charts illustrating the complementary high_body signal, low_body signal, sensing FET body voltages, and bit line voltages in accordance with the preferred embodiment. The sense_amp_rst is shown in FIG. 3C with the exemplary voltage waveforms of sensing FET bodies. Referring to FIGS. 3A, 3B, and 3C, the low Vt state is activated before the sense amplifier is set, the floating body state is activated during sense amplifier set and the high Vt state is activated at stand-by after the sense amplifier is set.

While the present invention has been described with reference to the details of the embodiments of the invention shown in the drawing, these details are not intended to limit the scope of the invention as claimed in the appended claims.

What is claimed is:

1. A sense amplifier comprising:
   a silicon-on-insulator (SOI) field effect transistor; and
   a tri-state body charge modulation circuit coupled to a body of said silicon-on-insulator (SOI) field effect transistor; said body charge modulation circuit providing a high body bias preparatory state; a floating body state and a low body bias stand-by state.

2. A sense amplifier as recited in claim 1 wherein said tri-state body charge modulation circuit includes a P-channel field effect transistor (PFET) and an N-channel field effect transistor (NFET) connected in series between a high voltage potential and a low voltage potential.

3. A sense amplifier as recited in claim 2 wherein a junction of the series connected PFET and NFET is coupled to the SOI FET body for providing said high body bias preparatory state; said floating body state and said low body bias stand-by state.

4. A sense amplifier as recited in claim 2 wherein said tri-state body charge modulation circuit includes a NAND gate and a NOR gate respectively providing a high body voltage signal and a low body voltage signal.

5. A sense amplifier as recited in claim 4 wherein said high body voltage signal output of the NAND gate is applied to the gate of PFET.

6. A sense amplifier as recited in claim 4 wherein said low body voltage signal output of the NOR gate is applied to the gate of NFET.

7. A sense amplifier as recited in claim 1 includes a pair of said silicon-on-insulator (SOI) field effect transistors on each side of complementary bitline structures of the sense amplifier.

8. A sense amplifier as recited in claim 7 wherein said tri-state body charge modulation circuit coupled to a body of each said silicon-on-insulator (SOI) field effect transistor includes a NAND gate and a NOR gate respectively providing a high body voltage signal and a low body voltage signal.

9. A sense amplifier as recited in claim 8 wherein said wherein said tri-state body charge modulation circuit includes a pair of series connected P-channel field effect transistor (PFET) and N-channel field effect transistor (NFET), each connected between a high voltage potential and a low voltage potential.

10. A sense amplifier as recited in claim 9 wherein a junction of each said series connected PFET and NFET is respectively coupled to the SOI FET body of said pair of said silicon-on-insulator (SOI) field effect transistors on each side of complementary bitline structures of the sense amplifier for providing said high body bias preparatory state; said floating body state and said low body bias stand-by state.

11. A sense amplifier as recited in claim 2 wherein each of said series connected PFET and NFET is substantially smaller than said silicon-on-insulator (SOI) field effect transistor.

12. A sense amplifier as recited in claim 1 wherein said high body bias preparatory state is activated before the sense amplifier is set.

13. A sense amplifier as recited in claim 1 wherein said floating body state is activated for high speed sensing during sense amplifier set.

14. A sense amplifier as recited in claim 1 wherein said low body bias stand-by state is activated after the sense amplifier is set.

15. A method for providing tri-state body charge modulation of a sense amplifier including a silicon-on-insulator (SOI) field effect transistor, said method comprising the steps of:
   providing a tri-state body charge modulation circuit coupled to a body of said silicon-on-insulator (SOI) field effect transistor; utilizing said body charge modulation circuit
   providing a high body bias preparatory state before the sense amplifier is set;
   providing a floating body state during sense amplifier set; and
   providing a low body bias stand-by state after the sense amplifier is set.

16. A method for providing tri-state body charge modulation of a sense amplifier as recited in claim 15 wherein the step of providing a tri-state body charge modulation circuit coupled to a body of said silicon-on-insulator (SOI) field effect transistor includes the steps of providing a series connected P-channel field effect transistor (PFET) and an N-channel field effect transistor (NFET) connected between a high voltage potential and a low voltage potential and connecting a junction of said PFET and NFET to said body of said silicon-on-insulator (SOI) field effect transistor.

17. A method for providing tri-state body charge modulation of a sense amplifier as recited in claim 15 wherein the step of providing a tri-state body charge modulation circuit coupled to a body of said silicon-on-insulator (SOI) field effect transistor includes the steps of providing a NAND gate and a NOR gate respectively for providing a high body voltage signal and a low body voltage signal; applying said high body voltage signal to a gate of said PFET and applying said low body voltage signal to a gate of said NFET.

* * * * *